United States Patent
Yeh et al.

(10) Patent No.: US 12,347,717 B2
(45) Date of Patent: Jul. 1, 2025

(54) DEBONDING STRUCTURES FOR WAFER BONDING

(71) Applicant: Taiwan Semiconductor Manufacturing Company, Ltd., Hsinchu (TW)

(72) Inventors: Wei-Ting Yeh, Hsinchu (TW); Zheng Yong Liang, Hsinchu (TW); De-Yang Chiou, Hsinchu (TW); Yu-Yun Peng, Hsinchu (TW); Keng-Chu Lin, Ping-Tung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 571 days.

(21) Appl. No.: 17/702,238

(22) Filed: Mar. 23, 2022

(65) Prior Publication Data

US 2022/0415696 A1    Dec. 29, 2022

Related U.S. Application Data

(60) Provisional application No. 63/214,572, filed on Jun. 24, 2021.

(51) Int. Cl.
*H01L 21/683* (2006.01)
*H01L 21/762* (2006.01)
*H01L 23/00* (2006.01)

(52) U.S. Cl.
CPC .... *H01L 21/6835* (2013.01); *H01L 21/76251* (2013.01); *H01L 24/29* (2013.01);
(Continued)

(58) Field of Classification Search
CPC ........... H01L 21/6835; H01L 21/76251; H01L 2221/68318; H01L 2221/68322;
(Continued)

(56) References Cited

U.S. PATENT DOCUMENTS 9,105,490 B2    8/2015  Wang et al.
9,236,267 B2    1/2016  De et al.
(Continued)

FOREIGN PATENT DOCUMENTS

EP       4138116 A1 *  2/2023 ........... H01L 21/185
FR       3082999 A1 * 12/2019 ......... H01L 21/6835
KR    20220097097 A *  7/2022

OTHER PUBLICATIONS

Park High-performance thin H:SiON OLED encapsulation layer deposited by PECVD at low temperature, RSC Adv., 2019,9, 58-64 (Year: 2019).*

Primary Examiner — Walter H Swanson
Assistant Examiner — Moataz Khalifa
(74) Attorney, Agent, or Firm — Sterne, Kessler, Goldstein & Fox P.L.L.C.

(57) ABSTRACT

The present disclosure describes a method to form a bonded semiconductor structure. The method includes forming a first bonding layer on a first wafer, forming a debonding structure on a second wafer, forming a second bonding layer on the debonding structure, bonding the first and second wafers with the first and second bonding layers, and debonding the second wafer from the first wafer via the debonding structure. The debonding structure includes a first barrier layer, a second barrier layer, and a water-containing dielectric layer between the first and second barrier layers.

20 Claims, 13 Drawing Sheets

(52) U.S. Cl.
CPC .............. *H01L 24/32* (2013.01); *H01L 24/83* (2013.01); *H01L 2221/68318* (2013.01); *H01L 2221/68327* (2013.01); *H01L 2221/68372* (2013.01); *H01L 2221/68386* (2013.01); *H01L 2224/32145* (2013.01); *H01L 2224/83026* (2013.01); *H01L 2224/83048* (2013.01); *H01L 2224/83896* (2013.01); *H01L 2924/0504* (2013.01); *H01L 2924/0544* (2013.01); *H01L 2924/059* (2013.01)

(58) Field of Classification Search
CPC ..................... H01L 2221/68386–68395; H01L 2224/32145; H01L 2224/83026; H01L 2224/83048; H01L 24/98; H01L 2221/68381
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 11,127,710 B2 * | 9/2021 | Benaissa ............. H01L 21/6836 |
| 2021/0358891 A1 * | 11/2021 | Chuang ............. H01L 29/78696 |
| 2022/0278074 A1 * | 9/2022 | Chen ........................ H01L 24/83 |
| 2022/0319901 A1 * | 10/2022 | Suwito ..................... H01L 24/00 |

* cited by examiner

DEBONDING STRUCTURES FOR WAFER BONDING

CROSS-REFERENCE TO RELATED APPLICATION

This application claims the benefit of U.S. Provisional Patent Application No. 63/214,572, titled "Wafer Cut with Bubble Material for Backside Process and Layer Transfer Application," filed Jun. 24, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down allows more semiconductor devices to be integrated into a given area but increases the complexity of semiconductor manufacturing processes. Semiconductor devices can be stacked vertically to scale down the dimensions, increase performance, and reduce cost. Wafer bonding is a technique to stack the semiconductor devices together.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
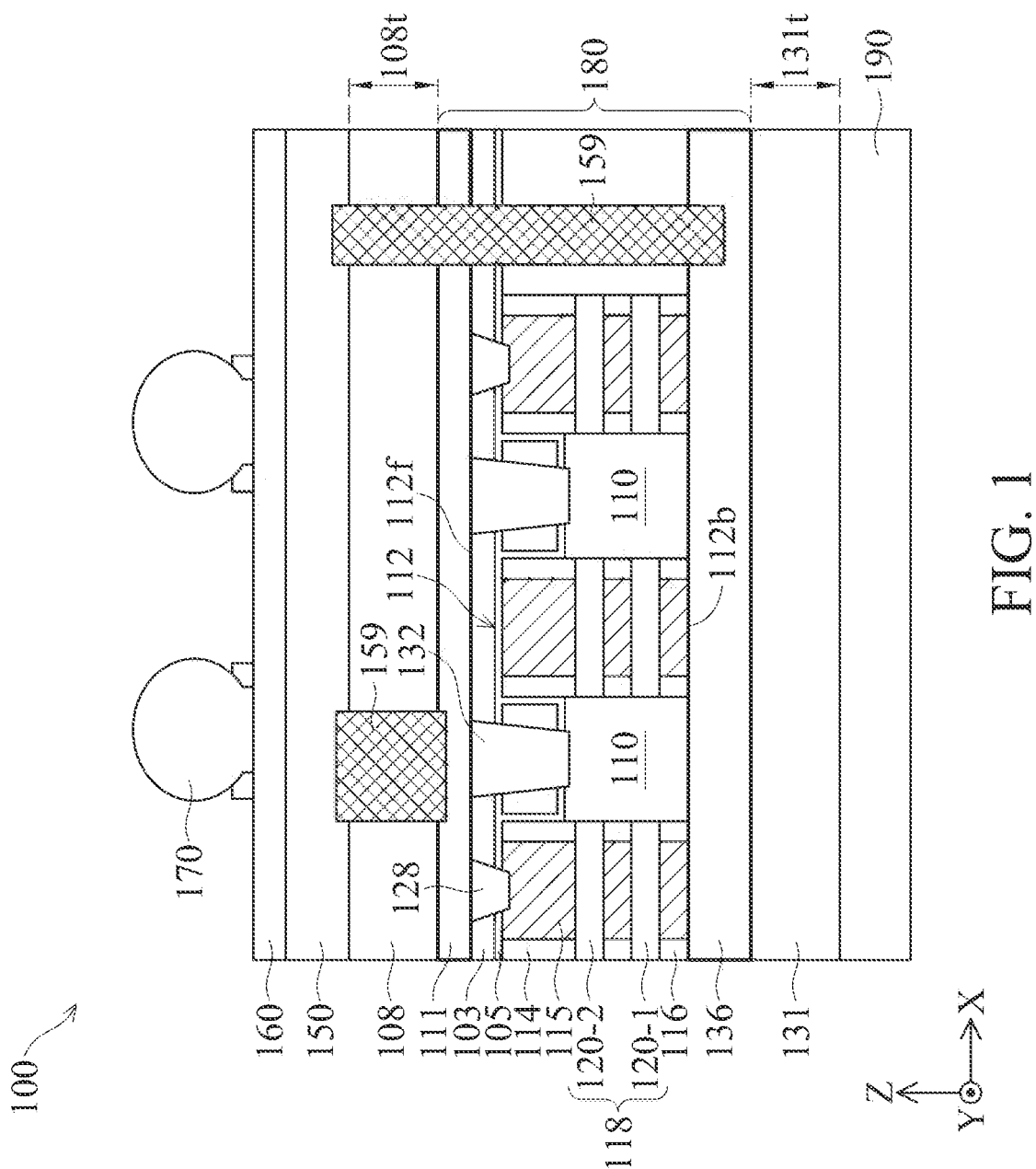
FIG. 1 illustrates a bonded semiconductor structure having a first wafer bonded to a second wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With the continuous scaling down of semiconductor devices, three-dimensional (3D) integrated circuits (ICs) are developed to resolve the limitations of the number and length of interconnections between semiconductor devices as the number of semiconductor devices increases. The development of 3D ICs requires improvements of wafer bonding for backside processes and device layer transfer and integration. In wafer bonding, two semiconductor wafers are bonded together to form a three dimensional structure without the need for an intervening substrate or device. One semiconductor wafer can be a carrier wafer and the other semiconductor wafer can be a device wafer having semiconductor devices. A bonding layer, such as silicon oxide, can be formed on each semiconductor wafer. The carrier wafer can be flipped and placed on top of the device wafer, with the bonding layers of these two semiconductor wafers in contact. After a bonding anneal, silicon-oxygen-silicon (Si—O—Si) bonds can form at the interface of the bonding layers and can bond the two semiconductor wafers together. This bonding process can be referred to as "wafer fusion bonding." The bond strength of the wafer fusion bonding can be sufficient to be compatible with subsequent semiconductor manufacturing processes. However, wafer fusion bonding may require wafer thin-down processes to debond the carrier wafer for integration of additional wafers or device layers onto the device wafer. The wafer thin-down processes may be expensive and may cause damage to the device wafer.

Adhesive bonding with polymer-based glues can reduce manufacturing cost by recycling carrier wafers through thermal-slide debonding. After the carrier wafer is bonded to the device wafer with the polymer-based glues, the carrier wafer can be debonded and removed in subsequent processes by heating the polymer-based glues. The carrier wafer can be recycled for additional bonding processes to reduce manufacturing cost. However, the adhesive bonding may not have the thermal compatibility for semiconductor manufacturing processes before the carrier wafer is debonded. The polymer-based glues can decompose under a lower temperature (e.g., about 200° C. to about 300° C.) than backside processes (e.g., about 350° C. to about 400° C.) of the device wafer. The carrier wafer may delaminate and peel off from the device wafer before being debonded.

Adhesive bonding with a laser-triggered light-to-heat debonding process can also have the problem of thermal compatibility to semiconductor manufacturing processes. In addition, a laser is used to heat the polymer-based glues for debonding. Therefore, the carrier wafer may need to be transparent for the laser to heat the polymer-based glues. However, transparent carrier wafers, such as quartz and glass, may not be compatible with silicon-based semiconductor manufacturing processes.

Various embodiments of the present disclosure provide example methods for bonding semiconductor wafers with a debonding structure and example bonded semiconductor structures fabricated with the same methods. According to some embodiments, the debonding structure can include a first barrier layer, a second barrier layer, and a water-containing dielectric layer between the first and second barrier layers. A first bonding layer can be formed on a device wafer. The debonding structure can be formed on a carrier wafer. A second bonding layer can be formed on the debonding structure. The carrier wafer can be bonded to the device wafer with the first and second bonding layers. After a backside process of the device wafer or a transfer of a device layer to the device wafer, the carrier wafer can be debonded from the device wafer via the debonding structure. The water in the water-containing dielectric layer can evaporate under various thermal treatments, such as microwave heating and rapid thermal annealing (RTA). The water vapor can form bubbles between the water-containing dielectric layer and the first and second barriers layers, which can cause delamination and peeling off to remove the carrier wafer. With the debonding structure, the carrier wafer can be recycled and used in additional wafer bonding processes, thus reducing semiconductor manufacturing cost. As the thermal treatments heat the water-containing dielectric layer, thermal damage and mechanical damage to the device wafer can be reduced. In addition, semiconductor manufacturing processes with the debonding structure may not require carrier wafers using quartz and can include silicon wafers, which are compatible with silicon-based semiconductor manufacturing processes.

FIG. 1 illustrates a bonded semiconductor structure 100 having a wafer 180 bonded to a wafer 190, in accordance with some embodiments. In some embodiments, wafer 180 can be a device wafer having one or more semiconductor devices 112 formed on a substrate. Wafer 190 can be a carrier wafer having a substrate. In some embodiments, wafer 180 can be a device wafer or carrier wafer, and wafer 190 can be a device wafer or a carrier wafer. In some embodiments, as shown in FIG. 1, bonded semiconductor structure 100 can include bonding structures 108 and 131, front-side interconnect layer 111, backside interconnect layer 136, through vias 159, a metal routing layer 150, a metal contact layer 160 and bump contacts 170.

Referring to FIG. 1, wafer 180 can include one or more semiconductor devices 112, such as MOSFETs, finFETs, and gate-all-around (GAA) FETs. Bonding structures 108 and 131 can bond wafer 180 to wafer 190 and other wafers during the fabrication processes. One or more semiconductor devices 112 can include fin structures 118, source/drain (S/D) epitaxial structures 110, gate structures 115, gate spacers 114, and inner spacer structures 116. In some embodiments, fin structures 118 can include semiconductor layers 120-1 and 120-2 (collectively referred to as "semiconductor layers 120"), as shown in FIG. 1. Gate structures 115 can be connected to front-side interconnect layer 111 through gate contact structures 128. S/D epitaxial structures 110 can be connected to front-side interconnect layer 111 through S/D contact structures 132. S/D epitaxial structures 110 can be connected to a backside interconnect layer 136. Front-side and backside interconnect layers 111 and 136 can be connected to metal routing layer 150 using through vias 159. Metal routing layer 150 can be further connected to metal contact layer 160 and bump contacts 170. Wafer 180 can further include other active devices, passive devices, and interconnections connected to one or more semiconductor devices 112.

Bonding structure 108 can be disposed between wafer 180 and metal routing layer 150. Bonding structure 131 can be disposed between wafer 180 and wafer 190. In some embodiments, bonding structures 108 and 131 can include a dielectric material, such as silicon oxide ($SiO_x$), silicon hydroxide (SiOH), silicon oxynitride (SiON), silicon nitride ($SiN_x$), silicon oxycarbide (SiOC), silicon oxynitricarbide (SiOCN), and a combination thereof. The dielectric material can bond wafer 180 to wafer 190 and other wafers. In some embodiments, bonding structure 108 can have a thickness 108t along a Z-axis ranging from about 5 nm to about 500 nm. If thickness 108t is less than about 5 nm, wafer 180 and wafer 190 may not be stably bonded together. If thickness 108t is greater than about 500 nm, bonding structure 108 may affect heat dissipation of semiconductor devices in bonded semiconductor structure 100. In some embodiments, bonding structure 131 can have a thickness 131t along a Z-axis ranging from about 5 nm to about 500 nm. If thickness 131t is less than about 5 nm, wafer 180 may not be stably bonded to other carrier wafers during the fabrication processes. If thickness 131t is greater than about 500 nm, bonding structure 131 may affect heat dissipation of semiconductor devices in bonded semiconductor structure 100.

Figure 4:
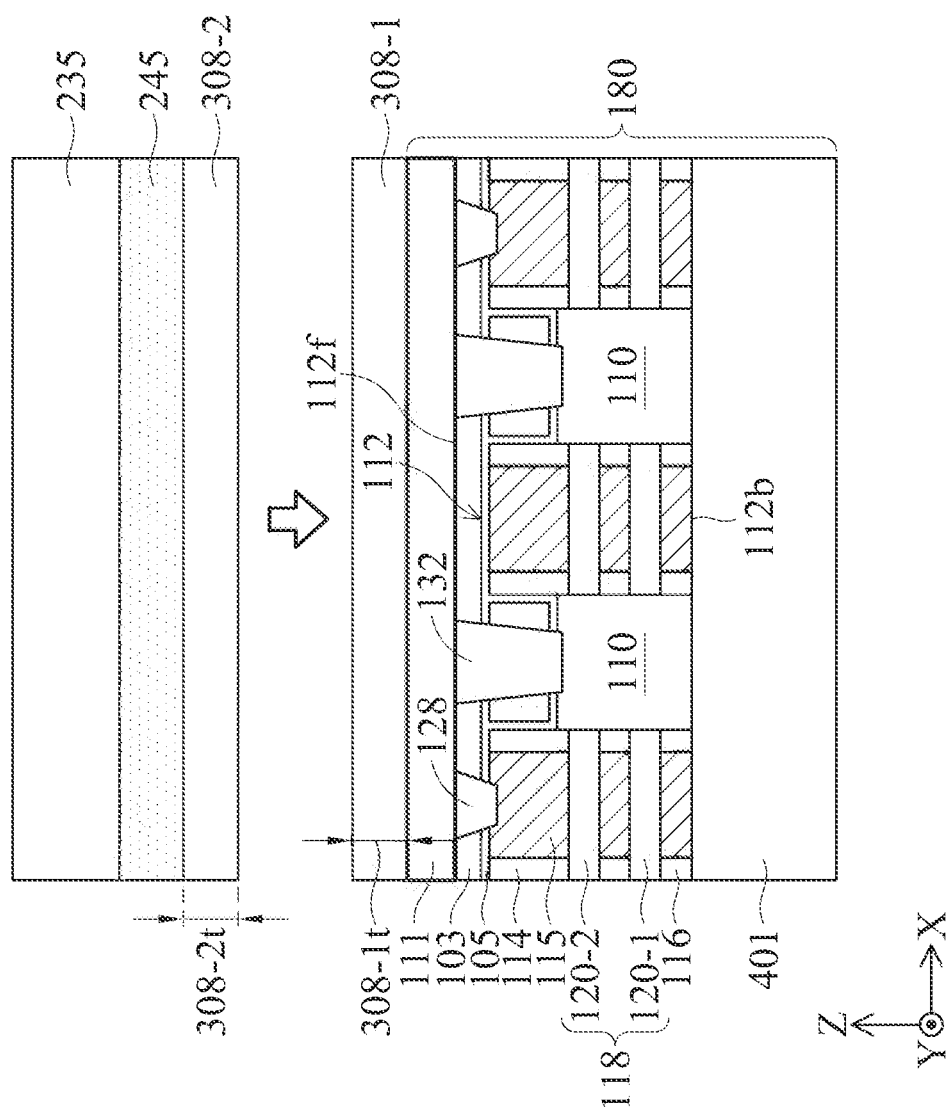

One or more semiconductor devices 112 can be formed on a substrate 401 of wafer 180, as shown in FIG. 4. Substrate 401 can include a semiconductor material, such as silicon. In some embodiments, substrate 401 includes a crystalline silicon substrate (e.g., wafer). In some embodiments, substrate 401 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; (iv) a semiconductor on insulator including silicon on insulator (SOI); or (v) a combination thereof. Further, substrate 401 can be doped depending on design requirements (e.g., p-type substrate or n-type substrate). In some embodiments, substrate 401 can be doped with p-type dopants (e.g., boron, indium, aluminum, or gallium) or n-type dopants (e.g., phosphorus or arsenic). In some embodiments, wafer 190 can include a substrate having a semiconductor material similar to wafer 180. In some embodiments, the substrate of wafer 190 can have a semiconductor material the same as or different from the semiconductor material of the substrate of wafer 180.

One or more semiconductor devices 112 can be connected to front-side interconnect layer 111. Front-side interconnect layer 111 can include one or more layers of metal vias and metal lines disposed on interlayer dielectric (ILD) layer 103. In some embodiments, the metal vias and the metal lines can include aluminum (Al), titanium nitride (TiN), tantalum nitride (TaN), tungsten (W), copper (Cu), and other suitable conductive materials. In some embodiments, ILD layer 103 can include a dielectric material deposited using a deposition method suitable for flowable dielectric materials. For example, flowable silicon oxide can be deposited using flowable chemical vapor deposition (FCVD). Referring to FIG. 1, etch stop layers (ESL) 105 can be disposed between ILD layer 103 and one or more semiconductor devices 112. In some embodiments, ESL 105 can include, for example, $SiN_x$, $SiO_x$, SiON, silicon carbide (SiC), silicon carbonitride (SiCN), or other suitable dielectric materials. In some embodiments, ESL 105 can protect underlying structures during the formation of the metal vias and the metal lines.

Referring to FIG. 1, each of semiconductor layers 120 in fin structures 118 can form a channel region underlying gate structures 115 of one or more semiconductor devices 112. S/D epitaxial structures 110 can function as source/drain regions of one or more semiconductor devices 112. Inner spacer structures 116 can isolate gate structures 115 and S/D epitaxial structures 110. In some embodiments, gate structures 115 can include gate dielectric layers and gate electrodes. In some embodiments, front-side interconnect layer 111 can connect to front side 112f of one or more semiconductor devices 112. Backside interconnect layer 136 can connect to backside 112b of one or more semiconductor devices 112.

Through vias 159 can extend through ILD layer 103 and bonding structure 108. Through vias 159 and front-side and backside interconnect layers 111 and 136 can connect one or more semiconductor devices 112 to metal routing layer 150 and other parts of bonded semiconductor structure 100. In some embodiments, through vias 159 can include a dielectric layer coated on the surface of through vias 159 to protect through vias 159.

Figure 2:
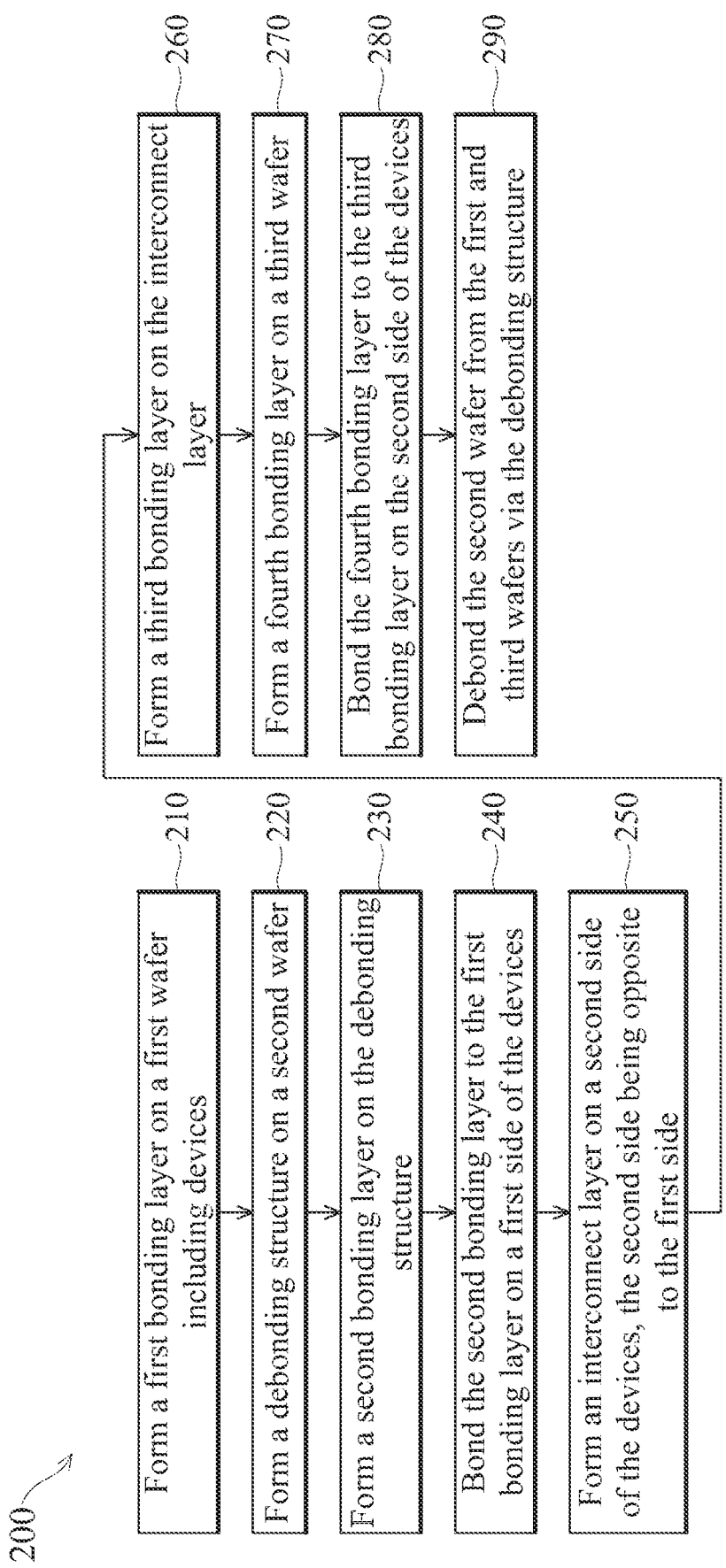
FIG. 2 is a flow diagram of a method for bonding a first wafer to a second wafer with a debonding structure, in accordance with some embodiments.
Figure 3:
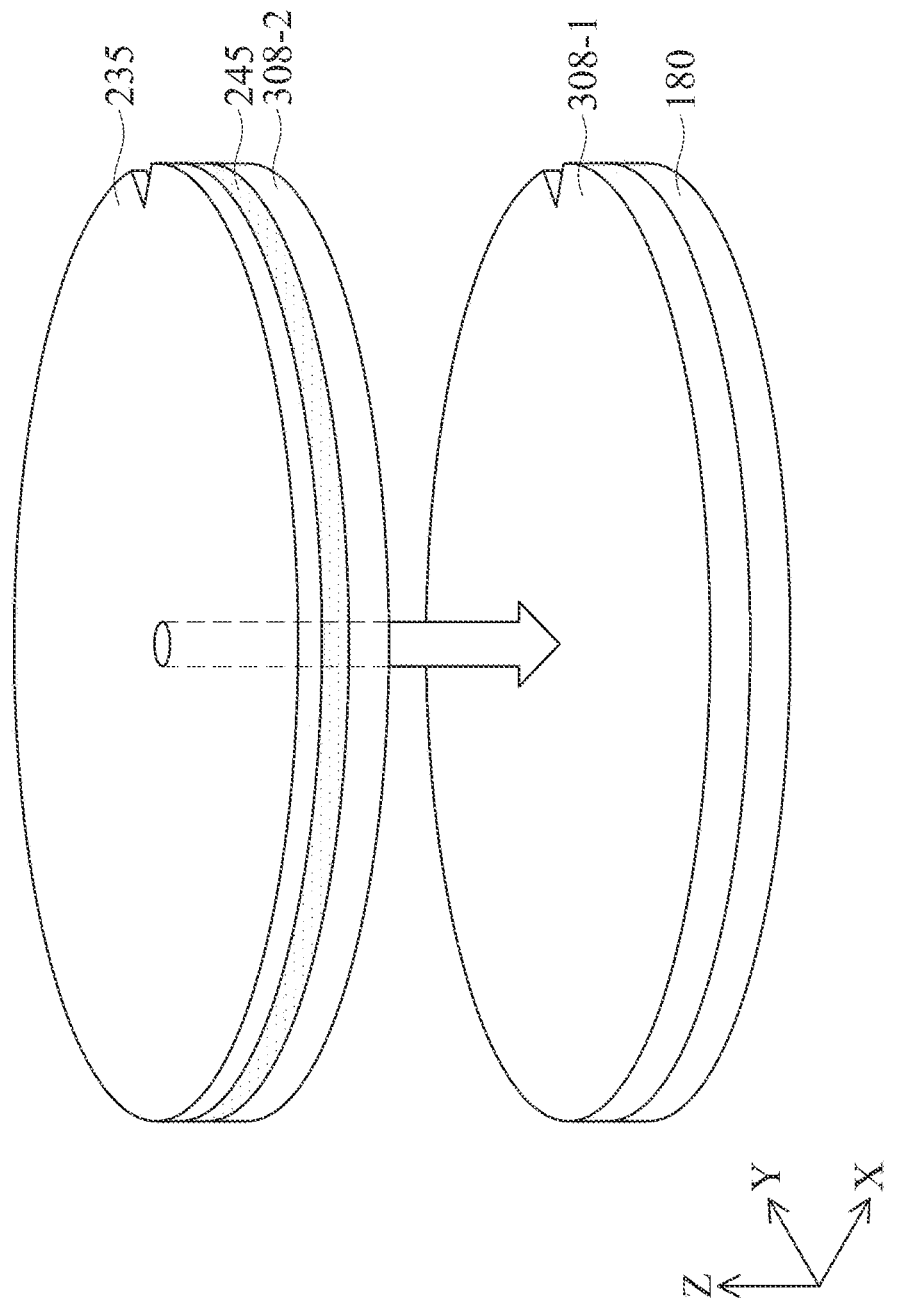
FIGS. 3-10 illustrate a bonded semiconductor structure having a first wafer bonded to a second wafer with a debonding structure at various stages of its fabrication process, in accordance with some embodiments.

FIG. 2 is a flow diagram of an example method 200 for bonding wafer 180 and wafer 235 with a debonding structure 245 shown in FIGS. 3 and 4, according to some embodiments. Method 200 may not be limited to the formation of bonded semiconductor structure 100 and can be applicable to other bonded structures and bonding processes. Additional fabrication operations may be performed between various operations of method 200 and may be omitted merely for clarity and ease of description. Additional processes can be provided before, during, and/or after method 200; one or more of these additional processes are briefly described herein. Moreover, not all operations may be needed to perform the disclosure provided herein. Additionally, some of the operations may be performed simultaneously or in a different order than shown in FIG. 2. In some embodiments, one or more other operations may be performed in addition to or in place of the presently-described operations. For illustrative purposes, the operations illustrated in FIG. 2 will be described with reference to the example fabrication process for bonding wafers 180 and 235 as illustrated in FIGS. 3-13. FIGS. 3-13 illustrate bonded semiconductor structure 100 having wafer 180 bonded to wafer 235 with a debonding structure 245 at various stages of its fabrication process, in accordance with some embodiment. Elements in FIGS. 3-13 with the same annotations as elements in FIG. 1 are described above.

In referring to FIG. 2, method 200 begins with operation 210 and the process of forming a first bonding layer on a first wafer including one or more semiconductor devices. For example, as shown in FIGS. 3 and 4, bonding layer 308-1 can be formed on wafer 180. In some embodiments, wafer 180 can be a device wafer having one or more semiconductor devices 112 formed on substrate 401, as shown in FIG. 4. Substrate 401 can include a semiconductor material, such as silicon. The formation of one or more semiconductor devices 112 can include the formation of fin structures 118 having semiconductor layers 120-1 and 120-2, the formation of gate spacers 114 and inner spacer structures 116, the formation of SD epitaxial structures 110, and the formation of gate structures 115. The formation of one or more semiconductor devices 112 can be followed by the formation of gate contact structures 128, the formation of S/D contact structures 132, and the formation of front-side interconnect layer 111. Front-side interconnect layer 111 can include one or more layers of metal vias and metal lines disposed on ILD layer 103. ESL 105 can be disposed between ILD layer 103 and one or more semiconductor devices 112 to protect underlying structures during the formation of the metal vias and the metal lines of front-side interconnect layer 111. The fabrication operations to form wafer 180 as a device wafer having one or more semiconductor devices 112 are not described in detail for ease of description.

Referring to FIGS. 3 and 4, bonding layer 308-1 can be formed on wafer 180. Bonding layer 308-1 can be formed by depositing a layer of dielectric material. In some embodiments, bonding layer 308-1 can be deposited by atomic layer deposition (ALD), chemical vapor deposition (CVD), plasma-enhanced chemical vapor deposition (PECVD), high density plasma (HDP), FCVD, or other suitable deposition methods. In some embodiments, bonding layer 308-1 can include a dielectric material, such as $SiO_x$, SiOH, SiON, $SiN_x$, SiOC, SiOCN, and a combination thereof. In some embodiments, bonding layer 308-1 can have a thickness 308-1t along a Z-axis ranging from about 5 nm to about 250 nm.

Figure 5:
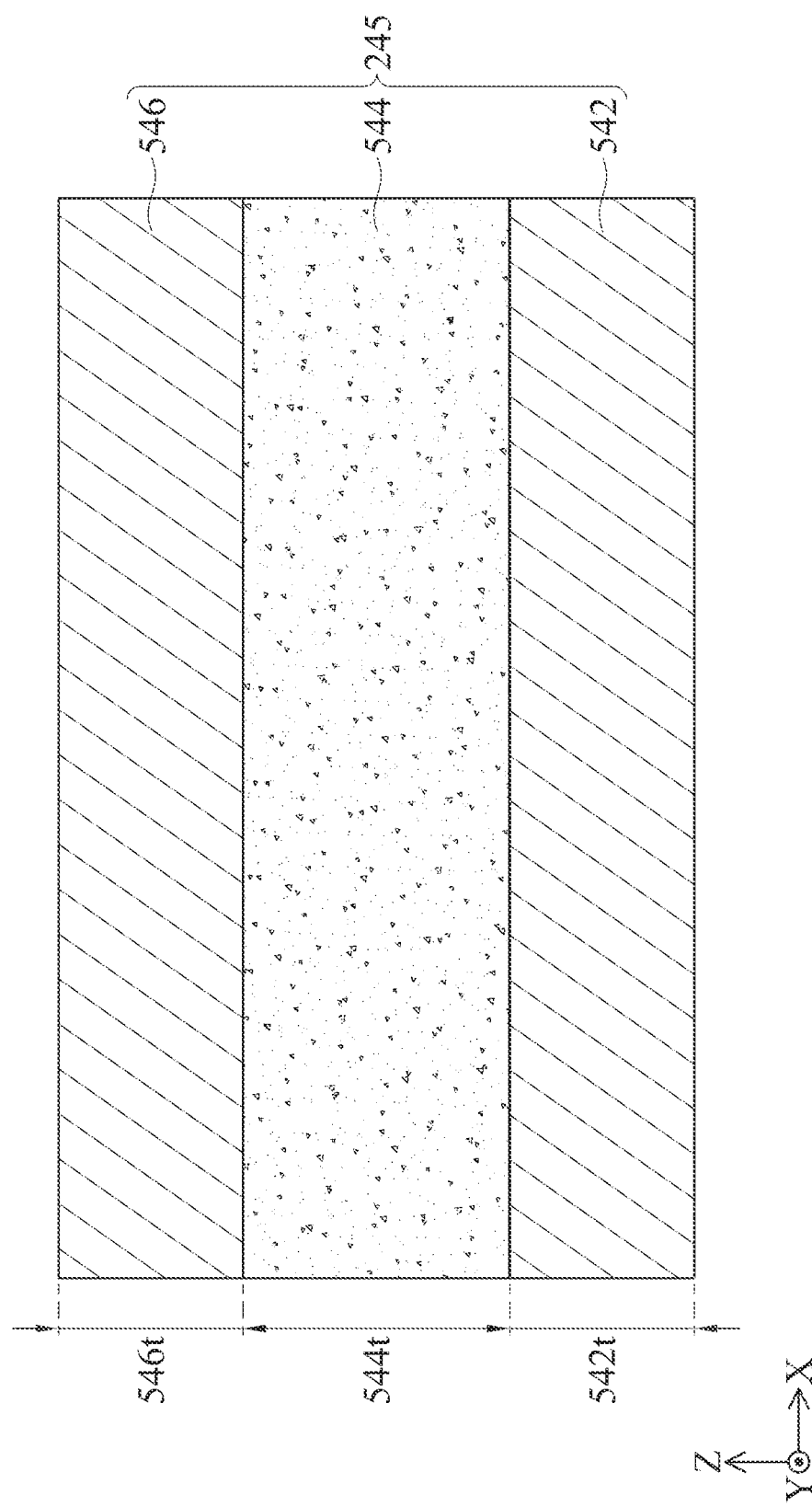

Referring to FIG. 2, in operation 220, a debonding structure is formed on a second wafer. For example, as shown in FIGS. 3-5, debonding structure 245 can be formed on wafer 235, which can be flipped upside down afterwards to stack on wafer 180. In some embodiments, wafer 235 can be a carrier wafer having a blanket substrate. The blanket substrate can include a semiconductor material similar to substrate 401, such as silicon. Debonding structure 245 can be formed on the blanket substrate of wafer 235. In some embodiments, as shown in FIGS. 3-5, the formation of debonding structure 245 can include forming a first barrier layer 542 on wafer 235, forming a water-containing dielectric layer 544 on first barrier layer 542, and forming a second barrier layer 546 on water-containing dielectric layer 544.

Referring to FIGS. 3-5, first barrier layer 542 can be blanket deposited on wafer 235 by ALD, CVD, or other suitable deposition methods. In some embodiments, first barrier layer 542 can include a nitride-based dielectric material, such as SiN$_x$. First barrier layer 542 can block the diffusion of the water in water-containing dielectric layer 544 to wafer 235 and adjacent structures. In some embodiments, first barrier layer 542 can have a thickness 542*t* along a Z-axis ranging from about 5 nm to about 30 nm. If thickness 542*t* is less than about 5 nm, first barrier layer 542 may not block the diffusion of the water in water containing dielectric layer 544. If thickness 542*t* is greater than about 30 nm, the blocking effect of first barrier layer 542 may not improve and manufacturing cost may increase.

The formation of first barrier layer 542 can be followed by forming water-containing dielectric layer 544 on first barrier layer 542. For example, as shown in FIGS. 3-5, water-containing dielectric layer 544 can be blanket deposited on first barrier layer 542 by plasma-enhanced ALD (PEALD), CVD, or other suitable deposition methods. In some embodiments, water-containing dielectric layer 544 can include a water-containing dielectric material, such as low temperature oxide (LTOX). LTOX can include SiO$_x$ deposited at a temperature from about 50° C. to about 100° C. As the temperature is lower than about 100° C., the water generated during the deposition process may not evaporate. As a result, LTOX can have water contained in SiO$_x$.

Figure 6:
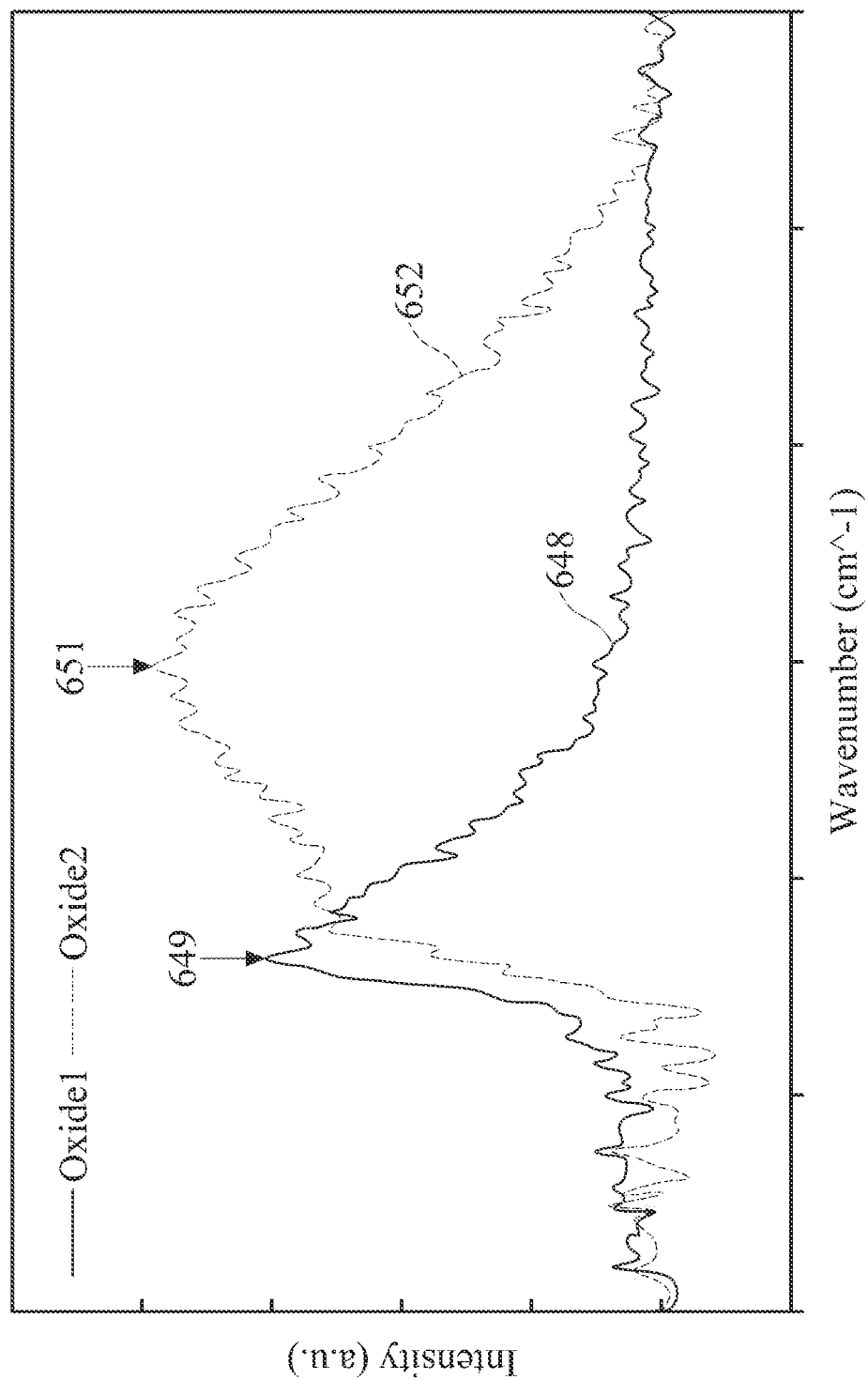

FIG. 6 illustrates a Fourier transform infrared spectroscopy (FTIR) spectra for a first oxide material (oxide1) and a second oxide material (oxide2), in accordance with some embodiments. Oxide1 can be SiO$_x$ formed at a temperature higher than about 100° C., and oxide2 can LTOX formed at a temperature from about 50° C. to about 100° C. As shown in FIG. 6, FTIR spectrum 648 for oxide1 can have a peak 649 indicating Si—OH. FTIR spectrum 652 for oxide2 can have a peak 651 indicating H$_2$O (water). As a result, FIG. 6 illustrates that oxide2, such as LTOX, can contain water. In some embodiments, a percentage of water by weight in water-containing dielectric layer 544 can range from about 1% to about 50%. If the percentage is lower than about 1%, debonding structure 245 may not contain enough water to debond wafer 235 in subsequent processes. If the percentage is higher than about 50%, the water in water-containing dielectric layer 544 may leak from side surfaces of debonding structure 245 and cause damage to wafers 235 and 180. In some embodiments, water-containing dielectric layer 544 can have a thickness 544*t* along a Z-axis ranging from about 5 nm to about 30 nm. In some embodiments, a ratio of thickness 544*t* to thickness 542*t* can range from about 0.5 to about 1.5. If thickness 544*t* is less than about 5 nm, or the ratio is less than about 0.5, water-containing dielectric layer 544 may not contain enough water to debond wafer 235 in subsequent processes. If thickness 544*t* is greater than about 30 nm, or the ratio is greater than about 1.5, the water in water-containing dielectric layer 544 may leak from side surfaces of debonding structure 245 and cause damage to wafers 235 and 180.

The formation of water-containing dielectric layer 544 can be followed by forming second barrier layer 546 on water-containing dielectric layer 544. For example, as shown in FIGS. 3-5, second barrier layer 546 can be blanket deposited on water-containing dielectric layer 544 by ALD, CVD, or other suitable deposition methods. In some embodiments, second barrier layer 546 can include a nitride-based dielectric material similar to first barrier layer 542. Second barrier layer 546 can also block the diffusion of the water in water-containing dielectric layer 544. In some embodiments, second barrier layer 546 can have a thickness 546*t* along a Z-axis ranging from about 5 nm to about 30 nm. If thickness 546*t* is less than about 5 nm, second barrier layer 546 may not block the diffusion of the water in water containing dielectric layer 544. If thickness 546*t* is greater than about 30 nm, the blocking effect of second barrier layer 546 may not improve and manufacturing cost may increase. In some embodiments, thickness 546*t* of second barrier layer 546 can be substantially the same as thickness 542*t* of first barrier layer 542.

Referring to FIG. 2, in operation 230, a second bonding layer is formed on the debonding structure. For example, as shown in FIGS. 3 and 4, bonding layer 308-2 can be formed on debonding structure 245. In some embodiments, bonding layer 308-2 can be blanket deposited on debonding structure 245 by the same deposition method used for bonding layer 308-1. In some embodiments, bonding layer 308-2 can include a dielectric material similar to bonding layer 308-1, such as SiO$_x$, SiOH, SiON, SiN$_x$, SiOC, SiOCN, and a combination thereof. In some embodiments, bonding layer 308-2 can have a thickness 308-2*t* along a Z-axis ranging from about 5 nm to about 250 nm.

Figure 7:
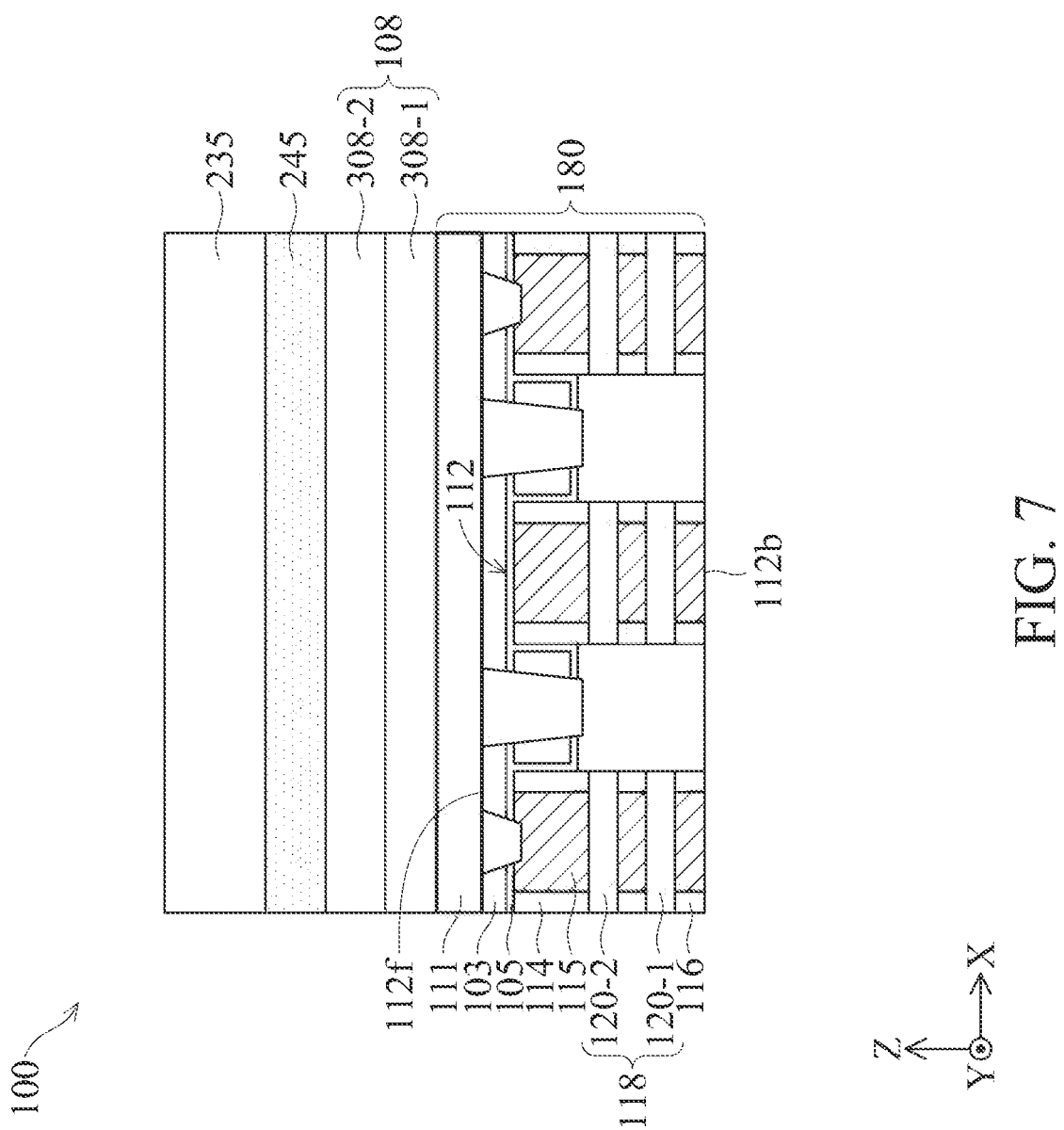

Referring to FIG. 2, in operation 240, the second bonding layer is bonded to the first bonding layer on a first side of the one or more semiconductor devices. For example, as shown in FIGS. 4 and 7, bonding layer 308-2 can be bonded to bonding layer 308-1 on a front side 112*f* of one or more semiconductor devices 112. After flipping wafer 235 upside down, bonding layers 308-1 and 308-2 can be attached to bond wafers 180 and 235 together. In some embodiments, the bonding operations to bond first and second bonding layers 308-1 and 308-2 can include: (1) treating surfaces of first and second bonding layers 308-1 and 308-2 in a plasma (e.g., argon plasma), (2) rinsing the plasma treated surfaces of first and second bonding layers 308-1 and 308-2 with deionized water, (3) attaching the surface of first bonding layer 308-1 to the surface of second bonding layer 308-2, and (4) treating the first and second bonding layers under a thermal condition. The plasma treatment in operation (1) can activate the surfaces of first and second bonding layers 308-1 and 308-2 and form dangling bonds at the surfaces. In operation (2), after rinsed in water, the dangling bonds can react with water and form SiOH at the surfaces of first and second bonding layers 308-1 and 308-2. In operations (3) and (4), the attached first and second bonding layers 308-1 and 308-2 can be annealed at a temperature from about 300° C. to about 600° C. to bond first and second bonding layers 308-1 and 308-2. SiOH at the surfaces of first and second bonding layers 308-1 and 308-2 can react and form stable Si—O—Si bonds according to the following equation:

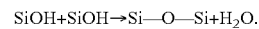

$$SiOH+SiOH \rightarrow Si-O-Si+H_2O.$$

In some embodiments, the bonding operations to bond first and second bonding layers 308-1 and 308-2 can include: (1) treating surfaces of first and second bonding layers 308-1 and 308-2 in a hydrogen plasma, (2) attaching the surface of first bonding layer 308-1 to the surface of second bonding layer 308-2, and (3) treating the first and second bonding layers under a thermal condition. The hydrogen plasma treatment can activate the surfaces of first and second bonding layers 308-1 and 308-2 and form SiOH at the surfaces. The following operations can be similar to the bonding operations after water rinsing as described above. After the bonding operations, second bonding layer 308-2 can be bonded to first bonding layer 308-1 to form bonding structure 108, as shown in FIG. 7.

Figure 8:
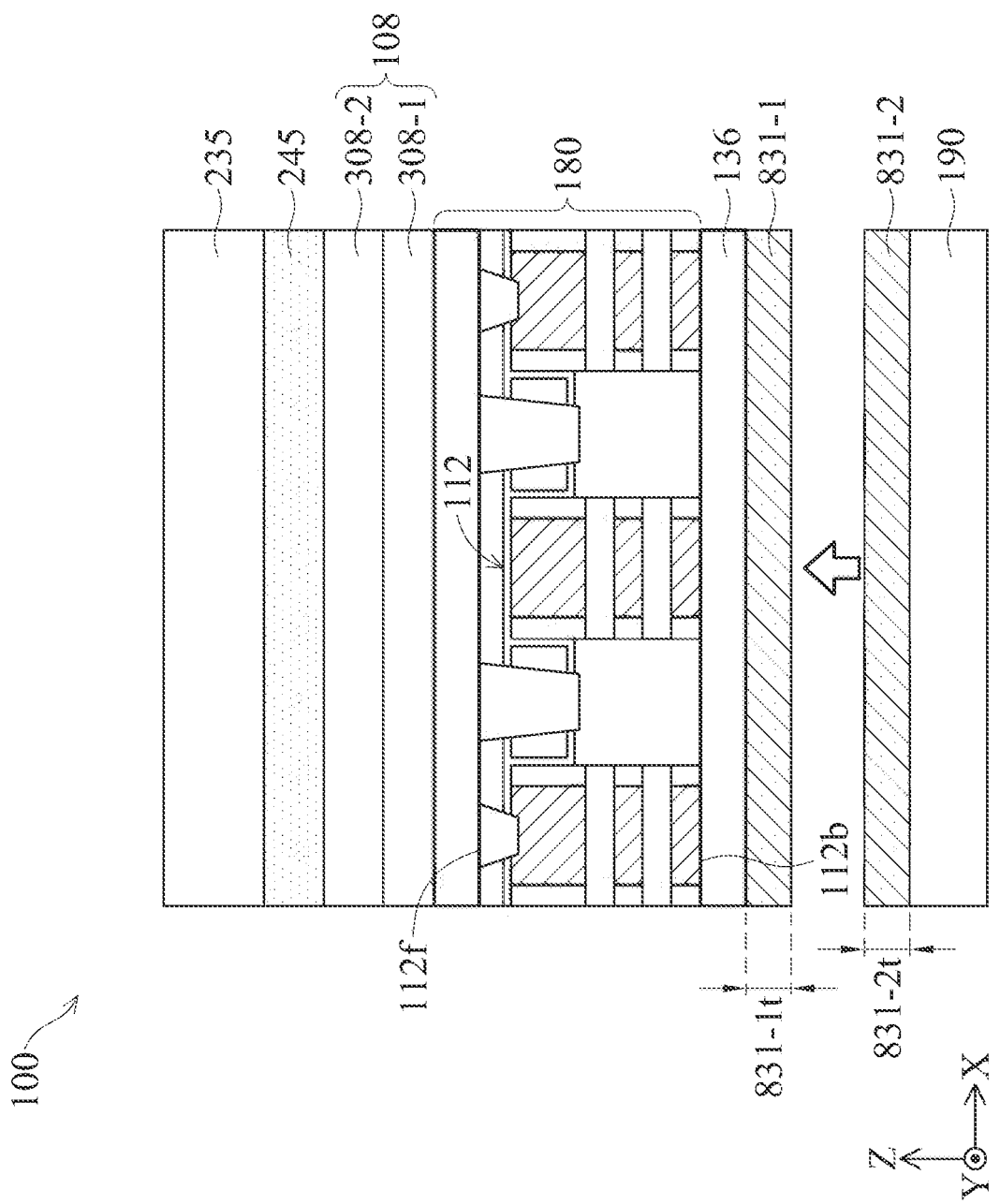

In operation 250 of FIG. 2, an interconnect layer is formed on a second side of the one or more semiconductor devices. The second side is opposite to the first side. For example, as shown in FIGS. 7 and 8, backside interconnect layer 136 can be formed on backside 112*b* of one or more semiconductor devices 112. Backside 112b is opposite to front side 112f. In some embodiments, the formation of backside interconnect layer 136 can include removing substrate 401 and forming metal lines and metal vias for backside interconnect layer 136. As shown in FIGS. 4 and 7, substrate 401 can be thinned down and removed through operations, such as grinding, chemical mechanical polishing (CMP), and etching. As shown in FIG. 8, backside interconnect layer 136 can be formed on backside 112b to include a stack of metal lines and metal vias (not shown) connected to one or more semiconductor devices 112.

In operation 260 of FIG. 2, a third bonding layer is formed on the interconnect layer. For example, as shown in FIG. 8, bonding layer 831-1 can be formed on backside interconnect layer 136. In some embodiments, bonding layer 831-1 can be blanket deposited on backside interconnect layer 136 by the same deposition method used for bonding layer 308-1. In some embodiments, bonding layer 831-1 can include a dielectric material similar to bonding layer 308-1, such as $SiO_x$, SiOH, SiON, $SiN_x$, SiOC, SiOCN, and a combination thereof. In some embodiments, bonding layer 831-1 can have a thickness 831-1t along a Z-axis ranging from about 5 nm to about 250 nm.

In operation 270 of FIG. 2, a fourth bonding layer is formed on a third wafer. For example, as shown in FIG. 8, bonding layer 831-2 can be formed on wafer 190. In some embodiments, wafer 190 can be a carrier wafer having a blanket substrate. The blanket substrate can include a semiconductor material similar to substrate 401, such as silicon. In some embodiments, bonding layer 831-2 can be blanket deposited on wafer 190 by the same deposition method used for bonding layer 308-1. In some embodiments, bonding layer 831-2 can include a dielectric material similar to bonding layer 308-1, such as $SiO_x$, SiOH, SiON, $SiN_x$, SiOC, SiOCN, and a combination thereof. In some embodiments, bonding layer 831-2 can have a thickness 831-2t along a Z-axis ranging from about 5 nm to about 250 nm.

Figure 10:
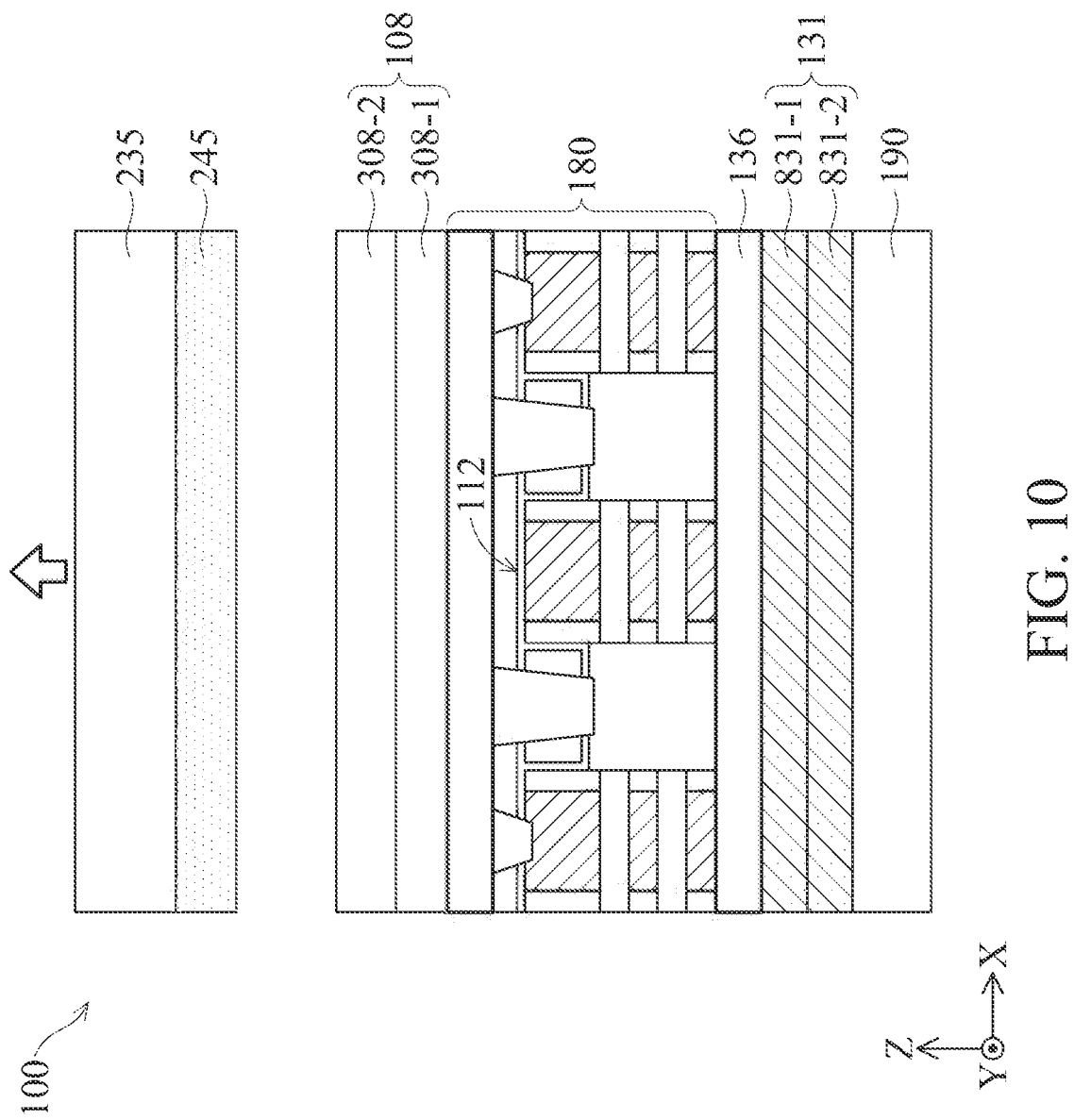

In operation 280 of FIG. 2, the fourth bonding layer is bonded to the third bonding layer on the second side of the one or more devices. For example, as shown in FIGS. 8 and 10, bonding layer 831-2 can be bonded to bonding layer 831-1 on backside 112b of one or more semiconductor devices 112. In some embodiments, the bonding operations to bond bonding layers 832-1 and 832-2 can be similar to the bonding operations to bond bonding layers 308-1 and 308-2, as described in operation 240.

Figure 9:
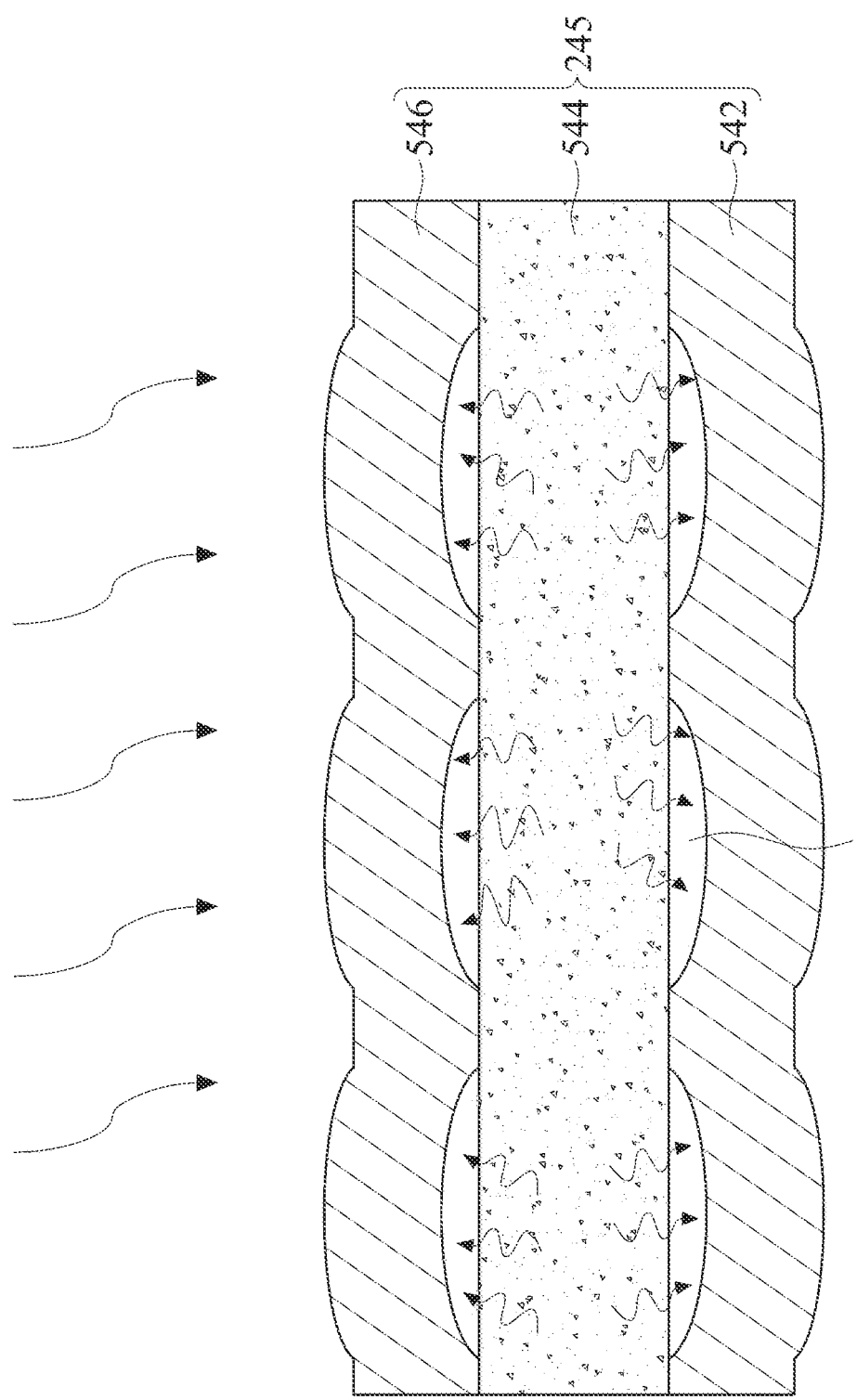

In operation 290 of FIG. 2, the second wafer is debonded from the first and third wafer via the debonding structure. For example, as shown in FIGS. 9 and 10, wafer 235 can be debonded from wafers 180 and 190 via debonding structure 245. Debonding structure 245 can be treated under a thermal condition to evaporate the water in water-containing dielectric layer 544. The water vapor can outgas and form bubbles 954 between first barrier layer 542 and water-containing dielectric layer 544 and between second barrier layer 546 and water-containing dielectric layer 544. In some embodiments, a microwave heating process can form bubbles 954 in FIG. 9. The bonded wafers 235, 180, and 190, including debonding structure 245, can be heated in a microwave oven at a temperature from about 600° C. to about 700° C. under a pressure from about 0.1 torr to about 5 torr. The microwave heating process can be performed for a time from about 1 minute to about 10 minutes with a power from about 1 kW to about 5 kW. A microwave at about 2.45 GHz can be used to selectively heat the water-containing dielectric layer 544. The water in water-containing dielectric layer 544 can outgas from water-containing dielectric layer 544 and form bubbles 954 shown in FIG. 9. The semiconductor materials, dielectric materials, and metals in wafers 180, 190, and 235 may not absorb electromagnetic energy of a microwave at about 2.45 GHz. Therefore, thermal damage to wafers 180, 190, and 235 and one or more semiconductor devices 112 can be minimized during the microwave heating process. In addition, as the metals in wafers 180 and 190 are covered with dielectric materials and semiconductor materials, the metals can cause minimal damage to the microwave oven. In some embodiments, the microwave heating process can be treated on the side of wafer 235 to minimize damage caused by metals in wafers 180 and 190, as debonding structure 245 can absorb most of the microwave energy.

In some embodiments, a rapid thermal anneal (RTA) process can form bubbles 954 shown in FIG. 9. The RTA process can heat bonded wafers 235, 180, and 190, including debonding structure 245, at a temperature from about 600° C. to about 1000° C. under a pressure from about 0.1 torr to about 15 torr. The RTA process can be performed for a short time from about 1 second to about 30 seconds. As a result, the water in water-containing dielectric layer 544 can evaporate and outgas from water-containing dielectric layer 544 and form bubbles 954 shown in FIG. 9. Wafers 180, 190, and 235 and one or more semiconductor devices 112 may not have thermal damage or copper electromigration due to the short time of the RTA process.

Bubbles 954 formed in the microwave heating process or RTA process can cause delamination of debonding structure 245 at interfaces between water-containing dielectric layer 544 and first and second barrier layers 542 and 546. Wafer 235 can be separated from wafers 180 and 190, as shown in FIG. 10. In some embodiments, wafer 235 can be separated at bubbles 954 of debonding structure 245 with vacuum chucks. In some embodiments, wafer 235 can be separated by inserting an object, such as a blade, into debonding structure 245 through bubbles 954. In some embodiments, after removal of wafer 235 and debonding structure 245, second barrier layer 546 may remain on bonding layer 308-2 and bonding structure 108 may have residue dielectric materials of second barrier layer 546, such as $SiN_x$. In some embodiments, after removal of wafer 235 and debonding structure 245, residue dielectric materials of second barrier layer 546 may be removed by polishing and cleaning processes.

After wafer 235 is removed, wafer 235 can be recycled and deposited with additional debonding structures and bonding layers for additional bonding processes. As a result, manufacturing cost can be reduced. In addition, as wafer 235 can include semiconductor materials, such as silicon, the bonding and debonding processes with wafer 235 and debonding structure 245 can be compatible with silicon-based semiconductor manufacturing processes.

Figure 11:
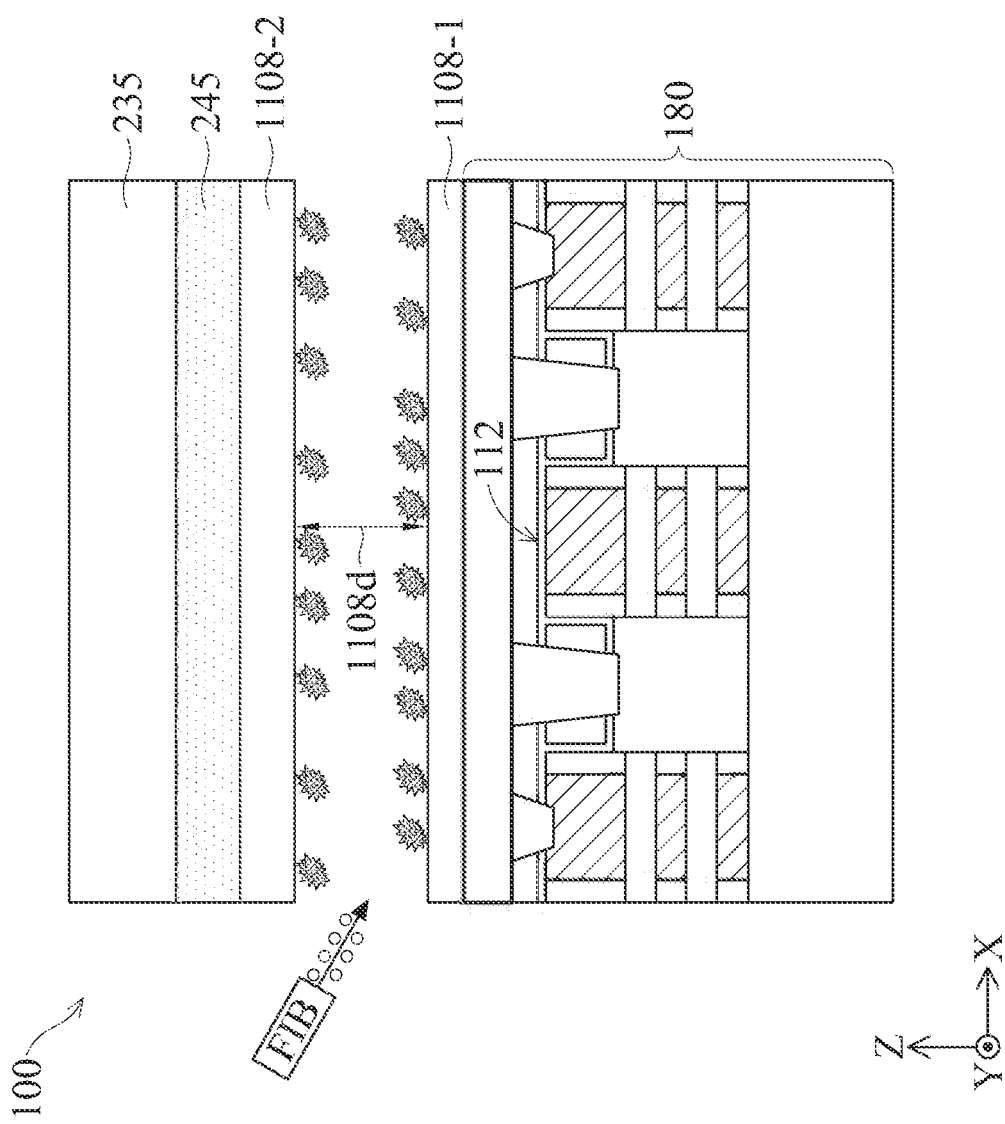
FIGS. 11-13 illustrate another bonded semiconductor structure having a first wafer bonded to a second wafer with a debonding structure at various stages of its fabrication process, in accordance with some embodiments.
Figure 12:
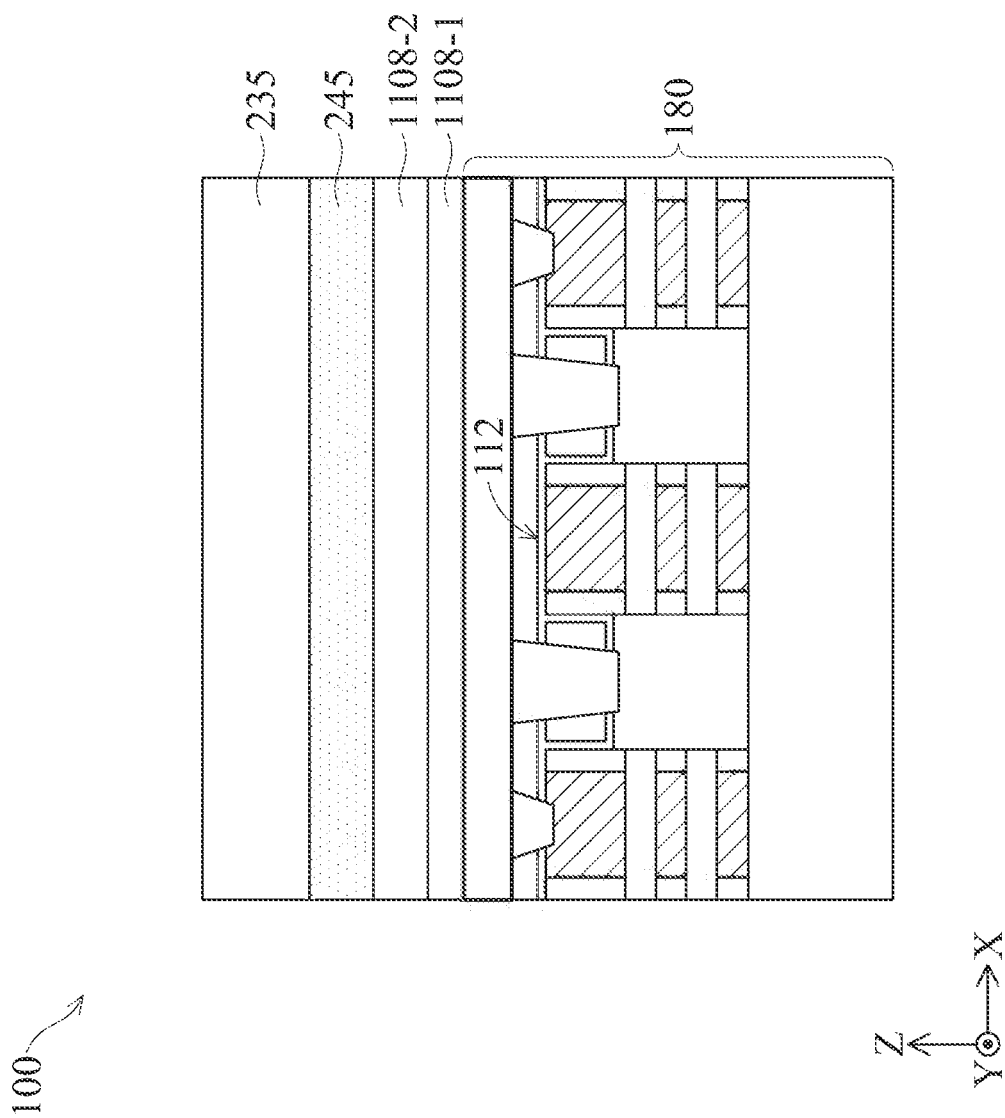
Figure 13:
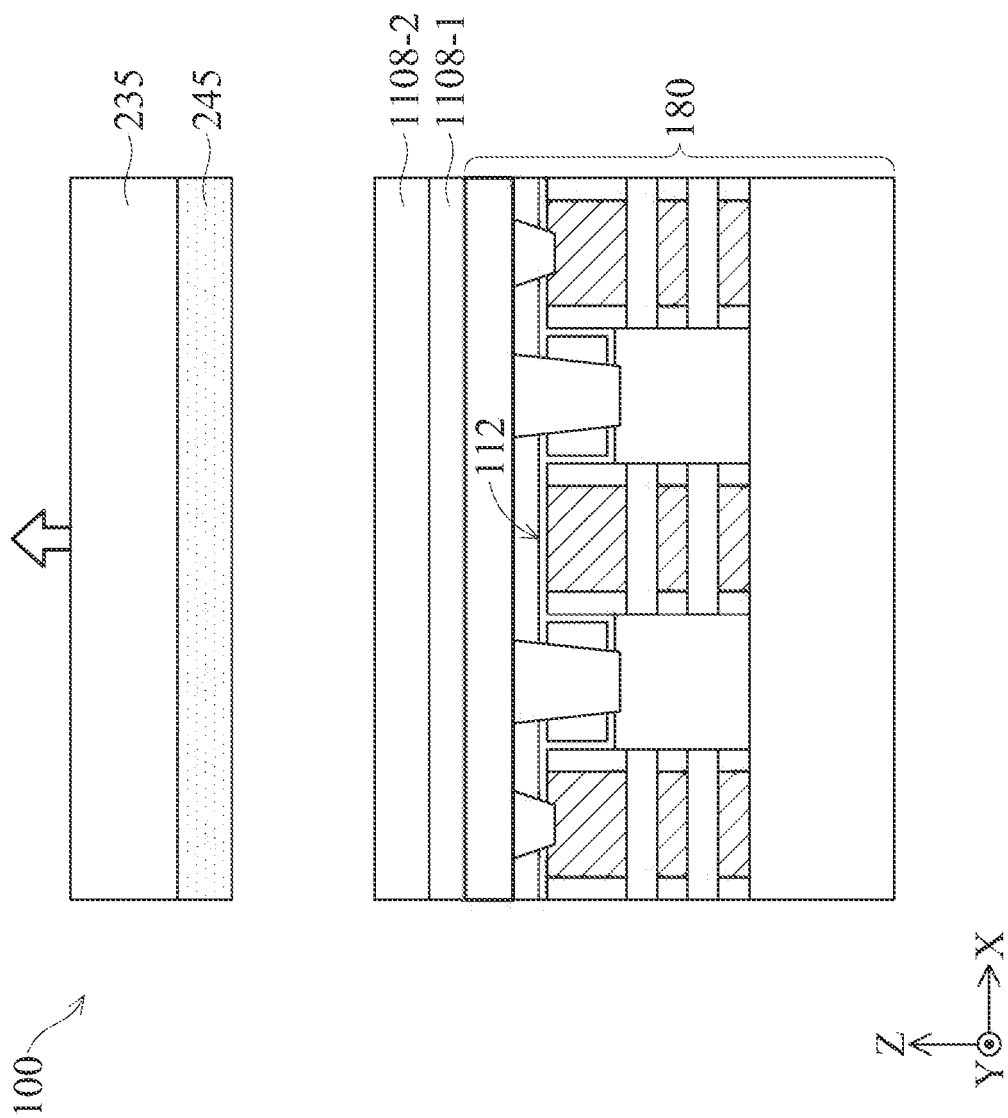

In some embodiments, wafer 235 and debonding structure 245 can transfer a device layer or a two dimensional material, such as graphene and boron nitride, to wafer 180 using surface activation bonding (SAB), as shown in FIGS. 11-13. In some embodiments, wafer 180 can be a device wafer includes one or more semiconductor devices 112. Referring to FIG. 11, bonding layer 1108-1 can be formed on wafer 180 and bonding layer 1108-2 can be formed on debonding structure 245. Bonding layer 1108-1 can include a silicon-based dielectric material, such as $SiO_x$ and $SiN_x$. Bonding layer 1108-2 can include a device layer or a two dimensional material, such as graphene and boron nitride, to be transferred to wafer 180. Surfaces of bonding layers 1108-1 and 1108-2 can be treated with a focused ion beam (FIB) using ions, such as argon, to activate the surfaces. A distance 1108d between bonding layers 1108-1 and 1108-2 can range from about 10 cm to about 30 cm. After attaching the activated surfaces of bonding layers 1108-1 and 1108-2, bonding layers 1108-1 and 1108-2 can react and bond to each other, as shown in FIG. 12. Referring to FIG. 13, wafer 235 and debonding structure 245 can be removed by a debonding process described in operation 290. As a result, bonding layer 1108-2 can be transferred to wafer 180 and wafer 235 can be recycled for additional bonding and debonding processes to reduce manufacturing cost.

The removal of wafer 235 and debonding structure 245 can be followed by the formation of through vias 159, metal routing layer 150, metal contact layer 160, and bump contacts 170, which are shown in FIG. 1. The fabrication operations are not described in details merely for ease of description. Though the present disclosure describes bonding wafer 180 and wafer 190 with wafer 235 and debonding structure 245, the methods of bonding and debonding wafers with wafer 235 and debonding structure 245 can be applied to additional wafers, device layers, and other suitable structures. Though the present disclosure illustrates bonded semiconductor structure 100 having two bonded wafers, bonded structures having more than two wafers can be fabricated for 3D IC with wafer 235 and debonding structure 245.

Various embodiments of the present disclosure provide example methods for bonding wafers 180, 190, and 235 with debonding structure 245. According to some embodiments, as shown in FIG. 5, debonding structure 245 can include first barrier layer 542, second barrier layer 546, and water-containing dielectric layer 544 between first and second barrier layers 542 and 546. Wafers 180 and 190 can be bonded together with bonding layers 308-1 and 308-2. After a backside process of wafer 180, wafer 235 can be debonded from wafer 180 via debonding structure 245. The water in water-containing dielectric layer 544 of debonding structure 245 can evaporate under thermal treatments, such as microwave heating and RTA. The water can outgas and form bubbles between water-containing dielectric layer 544 and the first and second barriers layers 542 and 546. The bubbles can cause delamination and peeling off of water-containing dielectric layer 544. Wafer 235 can be removed and recycled for additional bonding processes, thus reducing semiconductor manufacturing cost. As the thermal treatments heat water-containing dielectric layer 544, thermal damage and mechanical damage to wafers 180, 190, and 235 can be reduced. In addition, semiconductor manufacturing processes with debonding structure 245 may not require carrier wafers using quartz and can include silicon wafers, which are compatible with silicon-based semiconductor manufacturing processes.

In some embodiments, a method includes forming a first bonding layer on a first wafer, forming a debonding structure on a second wafer, forming a second bonding layer on the debonding structure, bonding the first and second wafers with the first and second bonding layers, and debonding the second wafer from the first wafer via the debonding structure. The debonding structure includes a first barrier layer, a second barrier layer, and a water-containing dielectric layer between the first and second barrier layers.

In some embodiments, a method includes forming a first bonding layer on a first wafer, forming a debonding structure on a second wafer, and forming a second bonding layer on the debonding structure. The first wafer includes multiple devices. The debonding structure includes a first barrier layer, a second barrier layer, and a water-containing dielectric layer between the first and second barrier layers. The method further includes bonding the second bonding layer to the first bonding layer on a first side of the multiple devices, forming an interconnect layer on a second side of the multiple devices, forming a third bonding layer on the interconnect layer, forming a fourth bonding layer on a third wafer, bonding the fourth bonding layer to the third bonding layer on the second side of the multiple devices, and debonding the second wafer from the first and third wafers via the debonding structure. The second side is opposite to the first side.

In some embodiments, a semiconductor structure includes a first bonding layer on a first wafer, a second bonding layer in contact with the first bonding layer, and a debonding structure in contact with the second bonding layer. The debonding structure includes a first barrier layer, a second barrier layer, and a water-containing dielectric layer between the first and second barrier layers. The semiconductor structure further includes a second wafer in contact with the second barrier layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first bonding layer on a first wafer;
forming a debonding structure on a second wafer, wherein the debonding structure comprises a first barrier layer, a second barrier layer, and a water-containing dielectric layer in contact and between the first and second barrier layers;
forming a second bonding layer on the debonding structure;
bonding the first and second wafers with the first and second bonding layers; and
debonding the second wafer from the first wafer via the debonding structure.

2. The method of claim 1, wherein the forming the debonding structure comprises:
depositing a layer of silicon nitride on the second wafer to form the first barrier layer;
depositing a layer of silicon oxide containing water on the first barrier layer at a temperature from about 50° C. to about 100° C. to form the water-containing dielectric layer; and
depositing an additional layer of silicon nitride on the water-containing dielectric layer to form the second barrier layer.

3. The method of claim 1, wherein the bonding the first and second wafers comprises:
treating a surface of the first bonding layer and a surface of the second bonding layer in a plasma;

rinsing the plasma treated surfaces of the first and second bonding layers with water;
attaching the rinsed surface of the second bonding layer to the rinsed surface of the first bonding layer; and
treating the first and second bonding layers under a thermal condition.

4. The method of claim 1, wherein the debonding the second wafer from the first wafer comprises:
treating the debonding structure under a thermal condition to form bubbles between the first barrier layer and the second barrier layer; and
separating the second wafer from the first wafer via the bubbles.

5. The method of claim 4, wherein the treating the debonding structure under the thermal condition comprises heating the debonding structure with a microwave at a temperature from about 600° C. to about 700° C.

6. The method of claim 4, wherein the treating the debonding structure under the thermal condition comprises heating the debonding structure with a rapid thermal anneal at a temperature from about 600° C. to about 1000° C.

7. The method of claim 4, wherein the separating the second wafer from the first wafer comprises separating the first and second wafers with vacuum chucks.

8. The method of claim 4, wherein the separating the second wafer from the first wafer comprises inserting a blade in the debonding structure.

9. The method of claim 1, wherein the forming the first bonding layer comprises forming a first silicon oxide layer, and wherein forming the second bonding layer comprises forming a second silicon oxide layer.

10. The method of claim 1, wherein the bonding the first and second wafers comprises:
treating surfaces of the first and second bonding layers with an ion beam; and
attaching the second bonding layer to the first bonding layer.

11. A method, comprising:
forming a first bonding layer on a first wafer, wherein the first wafer comprises a plurality of devices;
forming a debonding structure on a second wafer, wherein the debonding structure comprises a first barrier layer, a second barrier layer, and a water-containing dielectric layer between the first and second barrier layers, and wherein the second barrier layer is in contact with the second wafer;
forming a second bonding layer on the debonding structure;
bonding the second bonding layer to the first bonding layer on a first side of the plurality of devices;
forming an interconnect layer on a second side of the plurality of devices, wherein the second side is opposite to the first side;
forming a third bonding layer on the interconnect layer;
forming a fourth bonding layer on a third wafer;
bonding the fourth bonding layer to the third bonding layer on the second side of the plurality of devices; and
debonding the second wafer from the first and third wafers via the debonding structure.

12. The method of claim 11, wherein the forming the debonding structure comprises:
depositing a layer of silicon nitride on the second wafer to form the first barrier layer;
depositing a layer of silicon oxide containing water on the first barrier layer at a temperature from about 50° C. to about 100° C. to form the water-containing dielectric layer; and
depositing an additional layer of silicon nitride on the water-containing dielectric layer to form the second barrier layer.

13. The method of claim 11, wherein the bonding the second bonding layer to the first bonding layer comprises:
treating a surface of the first bonding layer and a surface of the second bonding layer in a plasma;
rinsing the plasma treated surfaces of the first and second bonding layers with water;
attaching the rinsed surface of the second bonding layer to the rinsed surface of the first bonding layer; and
treating the first and second bonding layers under a thermal condition.

14. The method of claim 11, wherein the debonding the second wafer from the first and third wafers comprises:
treating the debonding structure under a thermal condition to form bubbles between the first barrier layer and the second barrier layer; and
separating the second wafer from the first and third wafers via the bubbles.

15. The method of claim 14, wherein the treating the debonding structure under the thermal condition comprises heating the debonding structure with a microwave at a temperature from about 600° C. to about 700° C.

16. The method of claim 14, wherein the treating the debonding structure under the thermal condition comprises heating the debonding structure with a rapid thermal anneal at a temperature from about 600° C. to about 1000° C.

17. A method, comprising:
forming a first bonding layer on a first wafer;
depositing a first barrier layer on a second wafer;
depositing a water-containing dielectric layer on the first barrier layer;
depositing a second barrier layer in contact with the water-containing dielectric layer;
forming a second bonding layer on the second barrier layer, wherein the water-containing layer is between the second bonding layer and the second wafer;
bonding the first bonding layer to the second bonding layer; and
treating the water-containing dielectric layer to separate the second wafer from the first wafer.

18. The method of claim 17, wherein:
the first barrier layer comprises a layer of silicon nitride;
the water-containing dielectric layer comprises a layer of silicon oxide containing water; and
the second barrier layer comprises an additional layer of silicon nitride.

19. The method of claim 17, wherein the bonding the first bonding layer to the second bonding layer comprises:
treating a surface of the first bonding layer and a surface of the second bonding layer in a plasma;
rinsing the plasma treated surfaces of the first and second bonding layers with water;
attaching the rinsed surface of the second bonding layer to the rinsed surface of the first bonding layer; and
treating the first and second bonding layers under a thermal condition.

20. The method of claim 17, wherein the treating the water-containing dielectric layer to separate the second wafer from the first wafer comprises:
treating the water-containing dielectric layer under a thermal condition to form bubbles between the first barrier layer and the second barrier layer; and separating the second wafer from the first wafer via the bubbles.

\* \* \* \* \*